United States Patent [19]

Ray et al.

[11] 4,323,589
[45] Apr. 6, 1982

[54] PLASMA OXIDATION

[75] Inventors: Asit K. Ray, Mt. Kisco; Arnold Reisman, Yorktown Heights, both of N.Y.

[73] Assignee: International Business Machines Corporation, Armonk, N.Y.

[21] Appl. No.: 147,684

[22] Filed: May 7, 1980

[51] Int. Cl.³ .............................................. B05D 3/06
[52] U.S. Cl. .................................... 427/38; 118/50.1; 427/93
[58] Field of Search ............................ 427/38, 39, 93; 204/164; 118/723, 50.1

[56] References Cited

U.S. PATENT DOCUMENTS

| | | | |
|---|---|---|---|
| 3,108,900 | 10/1963 | Papp | 427/39 |
| 3,650,929 | 3/1972 | Lertes . | |
| 4,138,306 | 2/1979 | Niwa | 427/39 |
| 4,178,877 | 12/1979 | Kudo | 427/38 |
| 4,232,057 | 11/1980 | Ray et al. | 427/39 |

Primary Examiner—John H. Newsome
Attorney, Agent, or Firm—Pollock, Vande Sande & Priddy

[57] ABSTRACT

Plasma oxidation of the surface of a substrate which surface does not face towards the plasma is achieved by placing the substrate perpendicular to the plasma in a region at a pressure of at least about 10 mtorr.

14 Claims, 6 Drawing Figures

PLASMA OXIDATION

DESCRIPTION

Technical Field

The present invention is directed to oxidation of a conductive or semiconductive surface, and particularly is concerned with the oxidation of a conductive or semiconductive substrate which is to be employed in the fabrication of integrated circuits. The plasma oxidation of the present invention can be carried out at relatively low temperatures.

BACKGROUND ART

Oxidation of substrates, such as semiconductive substrates, has been performed thermally in either wet or dry ambients.

When the goals of ultra-microminaturization begin to come in reach, conventional processes of thermal oxidation become increasingly untenable because at the elevated temperatures that are involved in the developing complex structures, the device impurity profiles become redistributed and this, in turn, impacts device designs significantly.

An effort has been underway to find an oxidizing technique that can be practiced at lower temperatures, preferably below 700° C., at which temperature impurity diffusion coefficients become very small.

The art of plasma formation of oxide on semiconductors has been referred to as plasma growth, as plasma oxidation, or under circumstances where the semiconductor substrate is part of the anode electrode, the process is called anodization. In the article in "Solid State Electronics", Volume 17, page 627, 1974, oxide formation at constant voltage bias with no control of temperature is recorded.

Plasma oxidation of conductive or semiconductive materials and especially of a semiconductor, such as silicon, is of great interest since it has the potential of providing low temperature processing coupled with high oxidation rates. Low oxidation temperature essentially eliminates impurity redistribution and defect formation effects that are associated with normal high temperature oxidation processes.

The reported results on plasma oxidation vary widely with respect to the kinetics of the oxidation (e.g. linear or linear-parabolic), the frequency of the applied field (e.g. RF or microwave), the mode of plasma generation, such as with or without electrodes in the system, the use of biased or unbiased substrates (i.e. plasma anodization or oxidation), and the properties of the resultant plasma grown oxide (high flat band voltage). However, in all of these cases, the area of uniformly oxidized silicon was found to be very small and usually less than or equal to two square centimeters. In addition, the temperature of the oxidation was determined by the extent of plasma heating only. Accordingly, the reported results have not, in fact, been very promising. In our copending U.S. patent application, Ser. No. 16,648, filed Mar. 1, 1979, now Pat. No. 4,232,057 (427/39) plasma oxide formation on the semiconductor substrates is disclosed wherein the temperature control of the substrate, the pressure control, and the plasma power control are independent of each other. In the preferred embodiments in said application, the pressure is less than 3 mtorr. When a semiconductive substrate, such as silicon, is placed perpendicular to the direction of gas flow at varying distances from the plasma generating region in low pressure regions, such as at about 3 mtorr and less, $SiO_2$ is formed on the surface of the wafer facing the plasma. Upon examining the $Si-SiO_2$ interphase using conventional SEM techniques, it was found that $SiO_2$ is a deposited film. The thickness of the film increases linearly with time. In addition, it was noted that the rate of deposition increases with increasing power, decreasing pressure and decreasing distance from the plasma generating region. In addition, it was found that the rate of deposition is independent of the temperature of the substrate. Moreover, in this method, the deposited oxides exhibited etch rates and refractive indices quite comparable to thermal oxide. Fixed charge and interface state densities were reasonable but on the high side following high and low temperature pre- and post-metallization annealing processes respectively.

DISCLOSURE OF INVENTION

The present invention is concerned with a process for oxidizing by plasma oxidation one surface of a metallic-type electrically conductive substrate or semiconductive substrate. The process comprises placing the surface to be oxidized perpendicular to the flow of the plasma gas, and in a region having a pressure of at least about 10 mtorr. The surface of the substrate which is not to be oxidized faces the plasma. The surface of the substrate not facing the plasma is oxidized.

The process of the present invention results in the formation on the reverse side (i.e. that surface not facing towards the plasma) of oxides with properties substantially equivalent to oxides which are grown thermally. However, the temperature to which the substrate must be subjected is much less than that used for thermally grown oxide. This is advantageous since oxidation at high temperatures, particularly when the substrate is doped, tend to cause redistribution of or depletion of the doping. Moreover, the ability to employ lower temperatures reduces and minimizes the danger of defects of the substrate due to being subjected to the relatively high temperatures necessary for thermal oxide growth.

It is further noted that the process of the present invention makes it possible to uniformly oxidize relatively large areas whereby the film formd is usually uniform with a deviation of only up to 3%.

BEST AND VARIOUS MODES FOR CARRYING OUT INVENTION

The plasma oxidation process of the present invention is applicable for treating oxidizable metallic-type electrically conductive substrates and oxidizable semiconductive substrates. The metallic-type electrically conductive substrate can be an electrically conductive metal, mixtures of electrically conductive metals, electrically conductive metallic alloys, as well as nonmetallic materials, such as highly doped polycrystalline silicon or intermetallic silicides which, nevertheless, have electrical conductivities of the magnitude generally possessed by metals.

The present invention also contemplates the treatment of substrates containing semiconductive materials, such as silicon, polycrystalline silicon, and the like. Moreover, the substrates treated can contain mixtures of metallic-type materials and semiconductors. The preferred substrates treated according to the present invention are silicon and polycrystalline silicon. These substrates can be doped or undoped.

The process, according to the present invention, includes placing the surface to be oxidized perpendicular to the flow of the plasma gas. The surface of the substrate to be oxidized is placed facing away from, rather than towards, the plasma. The opposite surface which is not to be oxidized faces the plasma. It is quite surprising that, according to the present invention, the surface of the substrate which does not face towards the plasma is oxidized rather than the substrate which faces towards the plasma. Plasma is a state within a gas in which equal numbers of oppositely charged particles are to be found.

In order that the surface of the substrate not facing towards the plasma be oxidized, the substrate must be present in a region having a pressure of at least about 10 mtorr. The preferred pressure is about 10 to about 100 mtorr, and most preferably about 20 to about 50 mtorr.

The temperature of the substrate during the oxidation is generally about 300° to about 550° C., and preferably about 340° to about 525° C.

In addition, according to the present invention, the reverse side of the substrate to be oxidized can be masked so that only desired portions thereof, less than the entire surface, are oxidized. Some suitable oxidation resistant mask materials include magnesium oxide and $Si_3N_4$.

The process of the present invention is preferably carried out by employing independent controls for the temperature of the substrate, for the pressure, and for the plasma power.

Figure 1:
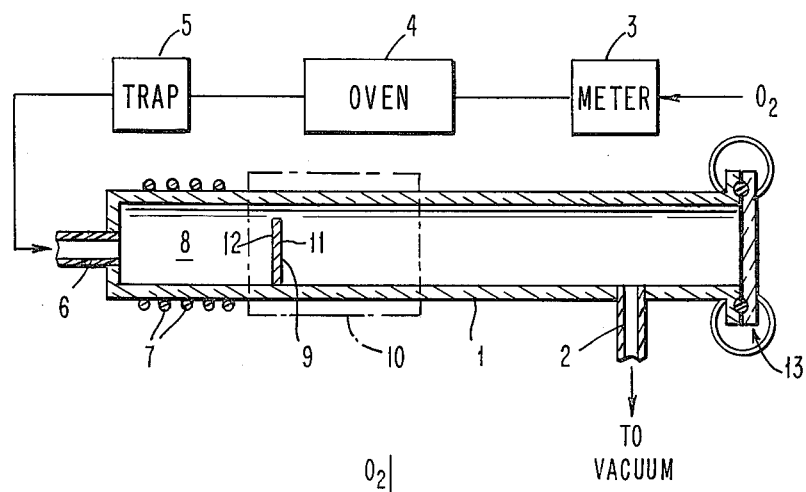
FIG. 1 is a schematic of an apparatus for practice of the present invention.

FIG. 1 is a schematic diagram of an apparatus suitable for carrying out the process of the present invention. In FIG. 1, a non-oxidizable container 1 (e.g. quartz) is shown which can be evacuated via conduit 2, and then a controlled amount of oxygen regulated by a mass flowmeter 3 is caused to flow through the system at a controlled pressure. The oxygen employed is preferably ultra-high purity (e.g. 99.99% $O_2$) which is further purified by being heated in an oven 4 to a temperature of about 900° C. to about 1100° C., and preferably about 1000° C. to decompose any hydrocarbons which might be present to $CO_2$ and $H_2O$. The $CO_2$ and $H_2O$ are removed from the $O_2$ by the liquid nitrogen trap 5. The oxygen is introduced into the container 1 via conduit 6. An oxygen plasma is generated by induction coil 7 connected to a variable power radio frequency generator (not shown).

Typical applied raido frequency power is about 1 to about 7 kilowatts, and preferably about 1 to about 2 kilowatts. The frequency of the applied power is about 0.5 megahertz to about 8 megahertz.

A substrate 9 is positioned vertically and perpendicular to the direction of gas flow. As noted, the substrate 9 is perpendicular to the plasma region 8 and outside the geometrical confines of the coil 7.

The temperature of the substrate can be independently controlled by the resistance heater 10.

Typical substrates treated according to the present invention are boron doped p-type silicon wafers about 12 mils thick, about $2\frac{1}{4}$ inches in diameter, and of general circular configuration. Also, as shown, the substrates are not electrodes in the system. When employing apparatus of the above-discussed general dimensions and operating at the above discussed conditions, the substrates are generally placed about $\frac{1}{2}$ to about 2 inches from the plasma generation region so that the substrates are subjected to the required pressure conditions.

As indicated, the backside 11 or reverse side of the substrate will be oxidized, whereas the front side 12 facing the plasma region will not. Since the substrate 9 is not an electrode in the process, electrode spurtering and electrode contamination do not occur. The apparatus also includes means 13 which can be opened to insert the substrate to be oxidized.

The oxidation process usually takes between about $\frac{1}{4}$ and about 8 hours for completion depending upon the thickness to be oxidized.

Typical flow rates for oxygen through the above-defined system are about 0.7 to about 6.5 standard cubic centimeters per minute.

In addition, if desired, the two substrates can be employed in the type of configuration illustrated in FIG. 1 whereby one is placed on one side of the RF coil, and the other is placed on the opposite side of the RF coil.

Figure 2:
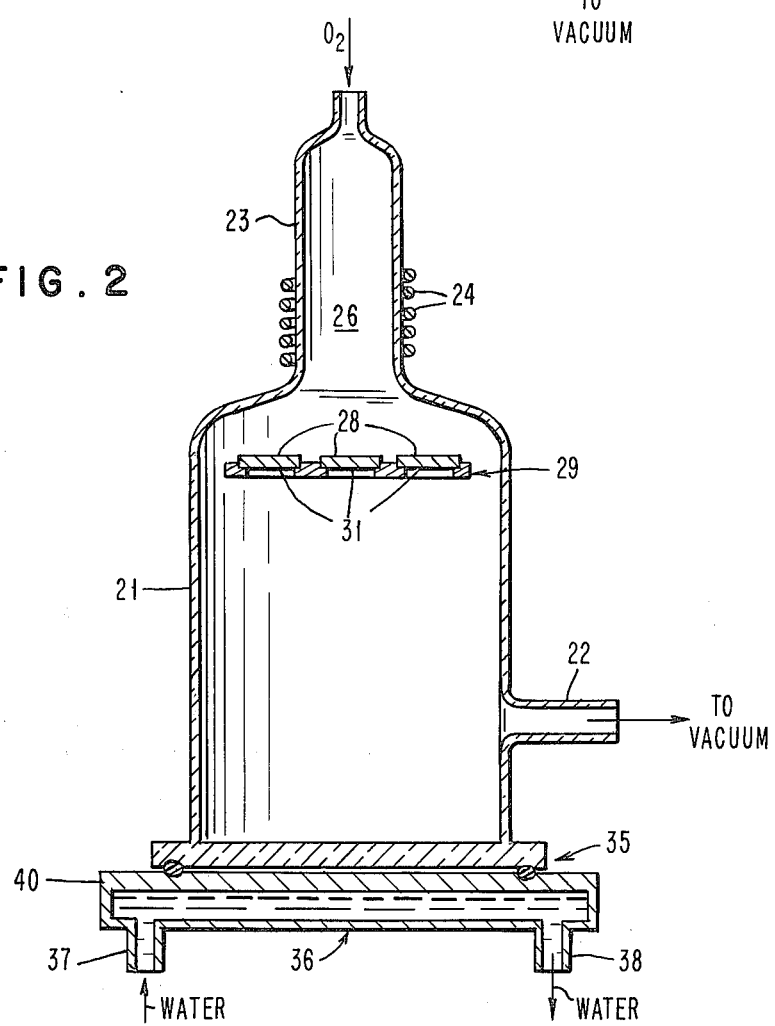
FIG. 2 is a schematic of an apparatus suitable for practice of the present invention, and adapted for the simultaneous treatment of multiple substrates.

FIG. 2 schematically illustrates another configuration which can be used to carry out the present invention whereby multiple substrates can be treated simultaneously.

In FIG. 2, a non-oxidizable belljar container 21 (e.g. quartz) is shown which can be evacuated via conduit 22 when connected to a vacuum system (not shown). A controlled amount of purified oxygen is caused to flow into said container 21 via conduit or neck 23. For a typical arrangement, neck 23 is about 80 mm in diameter. An oxygen plasma is generated by induction coil 24. The induction coil 24 is connected to a variable power radio frequency generator (not shown). This provides a plasma region 26 wherein the controlled ambient atmosphere is ionized using radio frequency excitation. The substrates 28 are located on holders at position 29.

The holders can be in the form of a large disc or other shape having cut-out portions corresponding in shape and size to the substrates to be oxidized whereby the substrates can be fitted into the cut-out portions. In addition, the holder can include legs attached to the disc or other shape for support on the bottom wall 40 of the container.

The substrates can be heated merely by the plasma gas or can be heated by resistance heaters (not shown). When the coil is located at 24, the surface 31 of the substrates will be oxidized.

The configuration of FIG. 2 also includes means 35 which can be opened for removal or insertion of substrates. Means 35 can be cooled by water cooling means 36 whereby cool water can be introduced via conduit 37 and removed via conduit 38.

Figure 3:
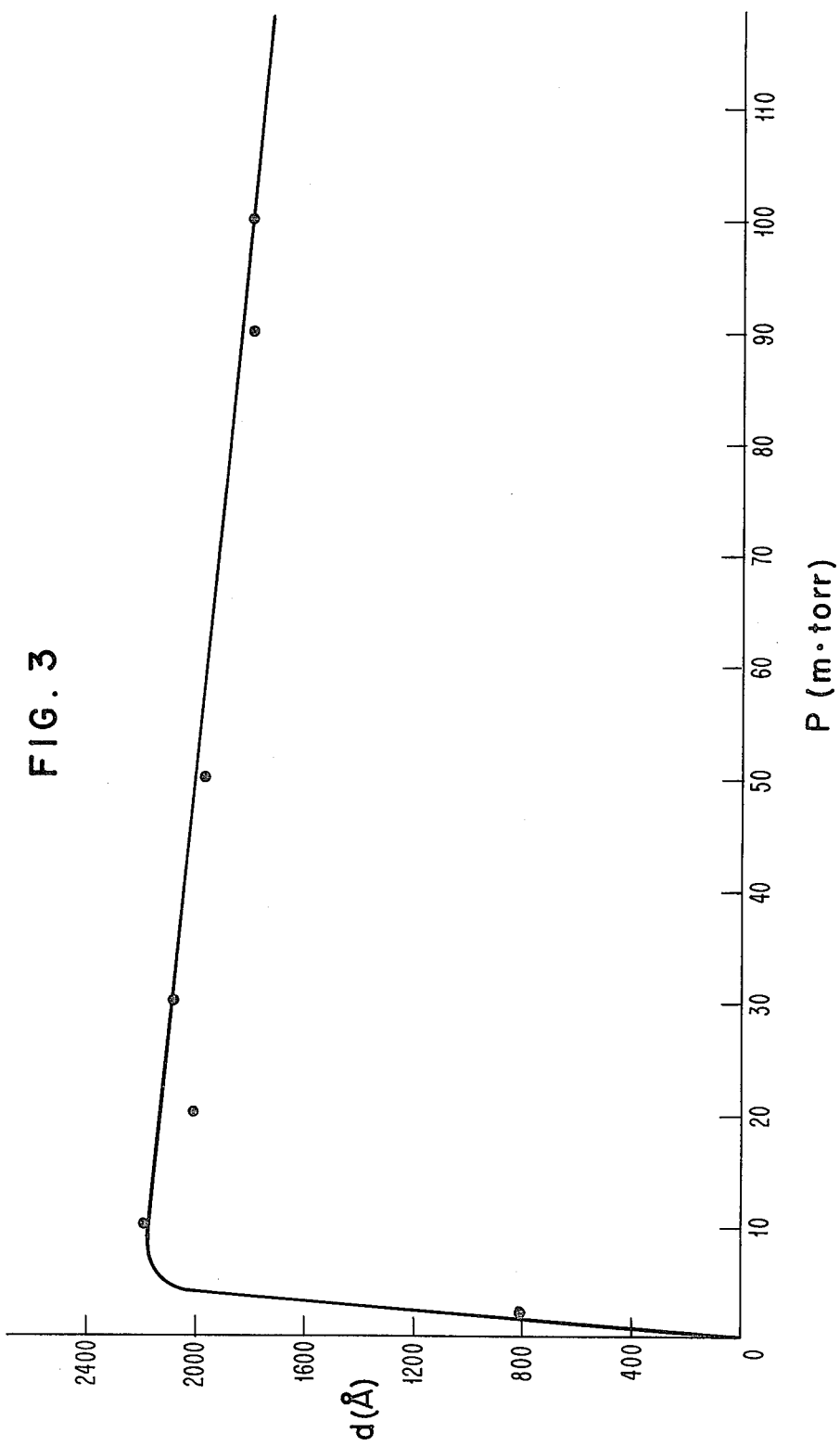
FIG. 3 is a graph of the variation of oxide growth rate with pressure.

FIG. 3 illustrates the oxide thickness as a function of the pressure at 2 kilowatts power for about 4 hours. It is noted that at about 10 mtorr the oxide thickness significantly increases and remains substantially the same although decreasing somewhat as the pressure increases.

Figure 4:
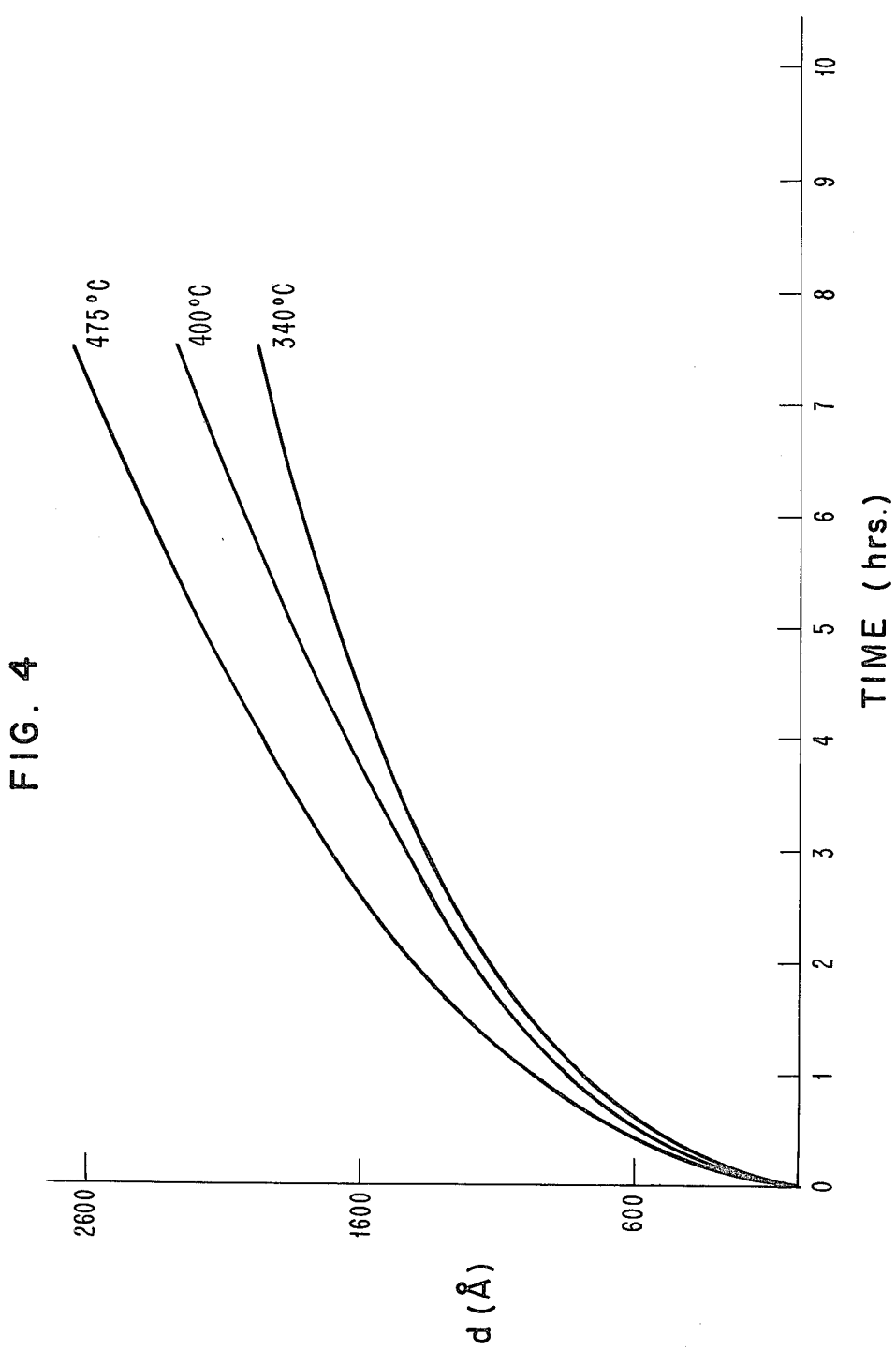
FIG. 4 is a graph of the variation of oxide growth rate with time at varying temperatures.

FIG. 4 illustrates the oxide thickness as a function of temperature over a period of time using a 1 kilowatt power, 2.15 SCCMO$_2$ and at 30 mtorr. As noted from these curves, higher temperatures provide increased growth rate.

Figure 5:
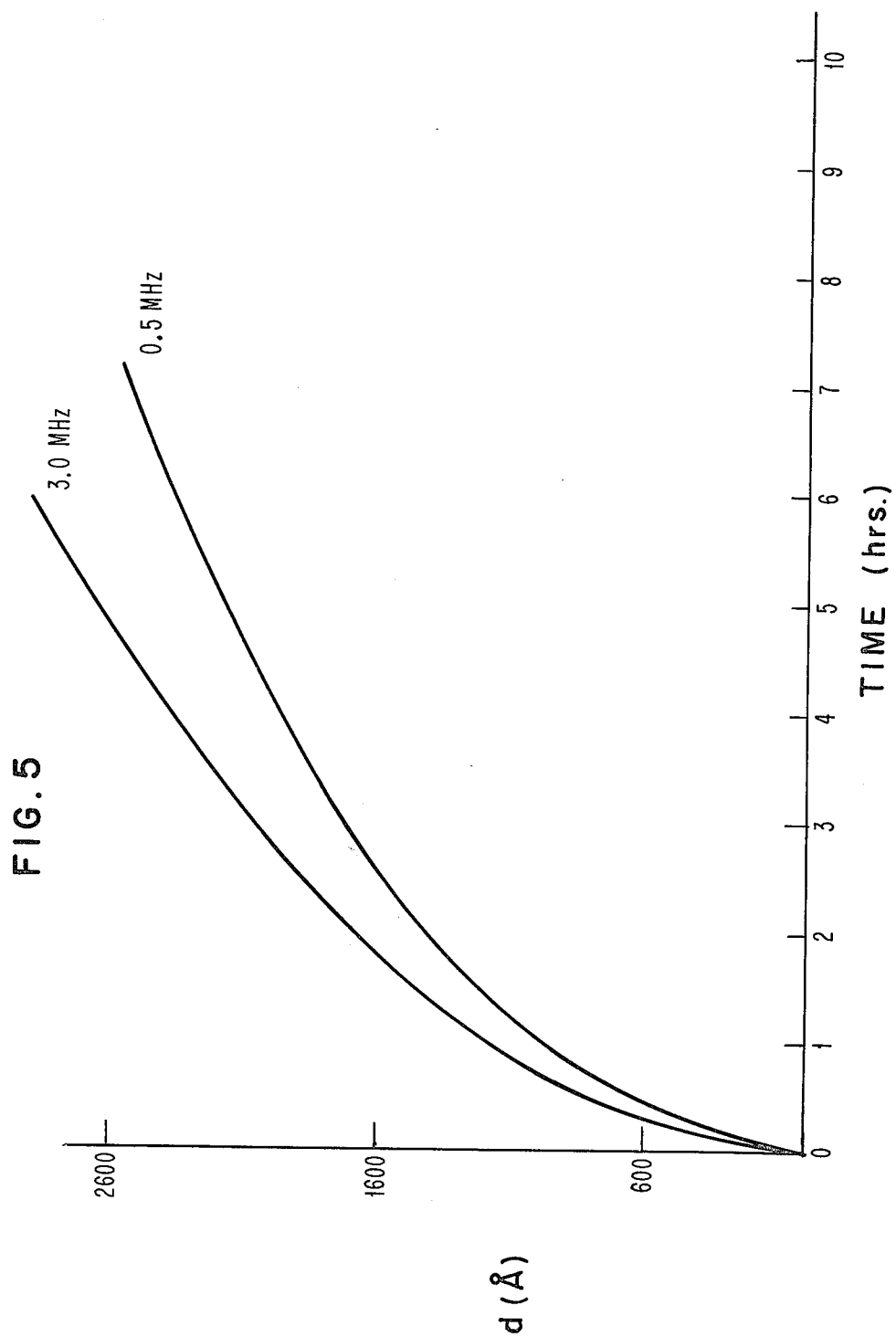
FIG. 5 is a graph of the variation of oxide growth rate with time for varying power.

FIG. 5 illustrates oxide thickness as a function of frequency of power at 475° C., oxygen flow rate of 2.15 SCCM and a pressure 30 mtorr and power of 1 kilowatt. It is noted that the frequency has very little effect on the oxidation process within the range shown.

Figure 6:
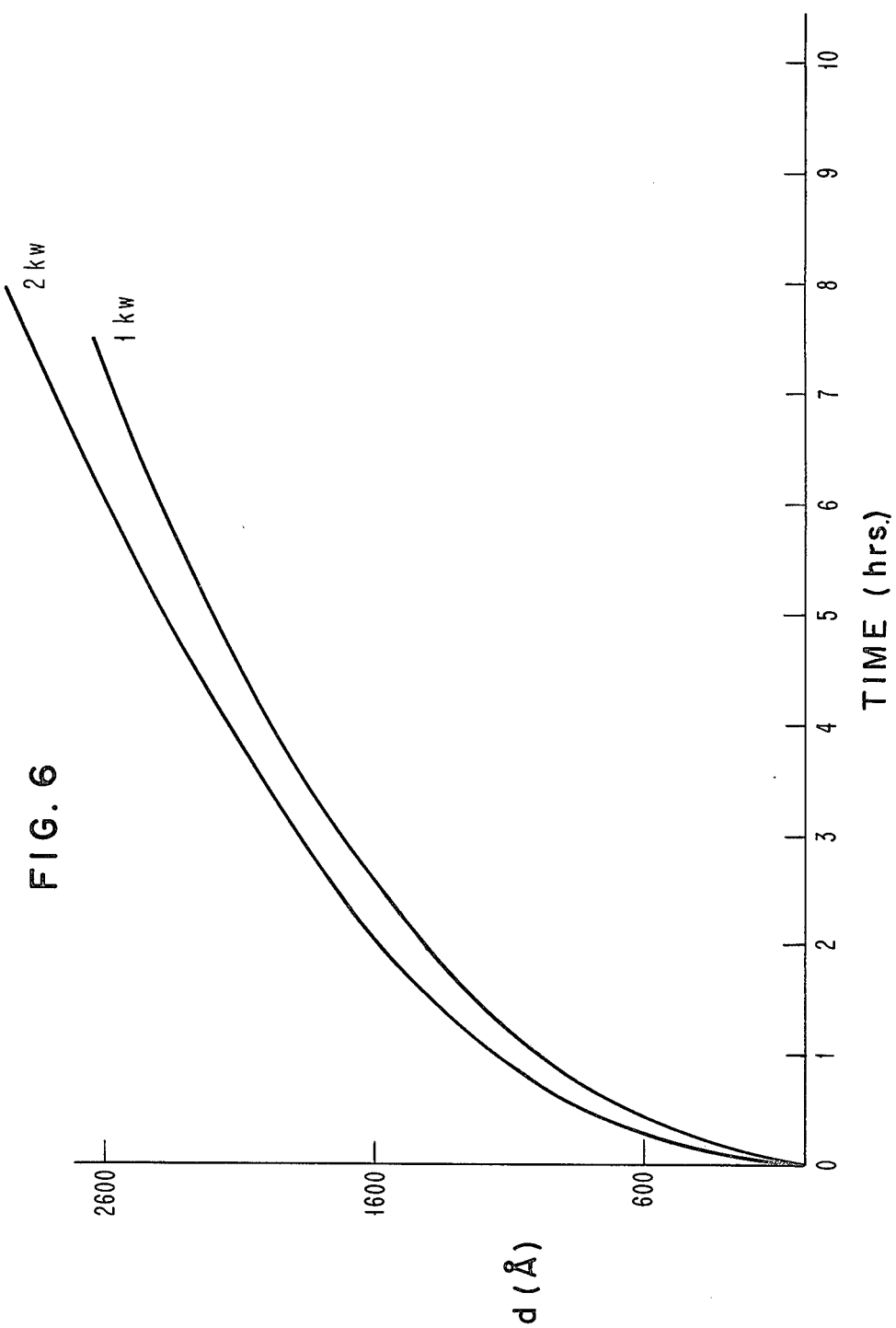
FIG. 6 is a graph of the variation of oxide thickness with time for varying frequencies of applied power.

FIG. 6 illustrates oxide thickness as a function of power at conditions of 475° C., oxygen flow rate of 2.15 SCCM, and 30 mtorr. It is noted that the power also within the range has a very low effect upon the oxide thickness.

What is claimed is:

1. A process for oxidizing by plasma one surface of a metallic-type electrically conductive substrate or semiconductive substrate which comprises placing the surface to be oxidized perpendicular to the flow of plasma gas and in a region having a pressure of about 10 mtorr to about 100 mtorr where the surface of the substrate which is not to be oxidized faces the plasma, and thereby oxidizing the surface of the substrate not facing the plasma.

2. The process of claim 1 wherein said substrate is a semiconductive substrate.

3. The process of claim 1 wherein said substrate is silicon or polycrystalline silicon.

4. The process of claim 3 wherein said substrate is doped.

5. The process of claim 1 wherein said pressure is about 20 to about 50 mtorr.

6. The process of claim 1 wherein the temperature of the substrate during the plasma oxidation is about 300° to about 550° C.

7. The process of claim 1 wherein the temperature of the substrate during the plasma oxidation is about 340° to about 525° C.

8. The process of claim 1 which is carried out employing independent controls for the temperature of the substrate, for the pressure, and for the plasma power.

9. The process of claim 1 wherein the plasma is generated by applied radio frequency power of about 1 to about 7 kilowatts.

10. The process of claim 1 wherein the plasma is obtained by applying radio frequency power of about 1 to about 2 kilowatts.

11. The process of claim 1 wherein the radio frequency of applied power is about 0.5 to about 8 megahertz.

12. The process of claim 1 wherein the oxidizing gas flows at a linear gas stream velocity of about 20 to 30 cm/sec.

13. The process of claim 1 wherein oxygen flow rate is about 0.7 to 10 SCC per minute.

14. The process of claim 1 wherein said substrate is outside of the geometrical confines of the means for generating the plasma.

* * * * *

UNITED STATES PATENT AND TRADEMARK OFFICE
CERTIFICATE OF CORRECTION

PATENT NO. : 4,323,589
DATED : April 6, 1982
INVENTOR(S) : Asit K. Ray and Arnold Reisman It is certified that error appears in the above—identified patent and that said Letters Patent is hereby corrected as shown below:

Column 2:
    On line 11, change "depositied" to --deposited--;
        line 44, change "formd" to --formed--.

Column 3:
    On line 61, change "raido" to --radio--.

Column 4:
    On line 16, change "spurtering" to --sputtering--.

Signed and Sealed this

Ninth Day of August 1983

[SEAL]

Attest:

GERALD J. MOSSINGHOFF

Attesting Officer     Commissioner of Patents and Trademarks